US011505975B2

(12) United States Patent
Son

(10) Patent No.: US 11,505,975 B2
(45) Date of Patent: Nov. 22, 2022

(54) OPENABLE DOOR MECHANISM

(71) Applicant: KYOCERA Document Solutions Inc., Osaka (JP)

(72) Inventor: Geki Son, Osaka (JP)

(73) Assignee: KYOCERA DOCUMENT SOLUTIONS INC., Osaka (JP)

( * ) Notice: Subject to any disclaimer, the term of this patent is extended or adjusted under 35 U.S.C. 154(b) by 0 days.

(21) Appl. No.: 17/352,508

(22) Filed: Jun. 21, 2021

(65) Prior Publication Data

US 2021/0404229 A1    Dec. 30, 2021

(30) Foreign Application Priority Data

Jun. 26, 2020   (JP) .............................. JP2020-110346

(51) Int. Cl.
| | |
|---|---|
| G03G 21/00 | (2006.01) |
| E05C 9/00 | (2006.01) |
| H05K 5/00 | (2006.01) |
| E05C 9/08 | (2006.01) |
| G03G 21/16 | (2006.01) |
| H05K 5/02 | (2006.01) |

(52) U.S. Cl.
CPC ............... *E05C 9/08* (2013.01); *E05C 9/002* (2013.01); *G03G 21/1633* (2013.01); *H05K 5/0221* (2013.01); *G03G 2221/169* (2013.01)

(58) Field of Classification Search
CPC .......... G03G 21/1633; G03G 2221/169; E05C 9/002; E05C 9/08; E05C 3/162; E05C 3/34; H02B 1/38; H05K 5/0221; H05K 5/0239

USPC ......... 399/124; 361/616, 726, 732; 174/109, 174/215, 293.2, 332.1; 49/395, 345, 346, 49/373, 394

See application file for complete search history.

(56) References Cited

U.S. PATENT DOCUMENTS

| | | | | |
|---|---|---|---|---|
| 6,170,928 | B1 * | 1/2001 | Eardley .................... | H02B 1/38 312/223.1 |
| 2010/0327718 | A1 * | 12/2010 | Muramoto ......... | G03G 21/1633 312/328 |
| 2011/0267657 | A1 * | 11/2011 | Tsujishita ........... | H04N 1/00546 358/296 |
| 2011/0318050 | A1 * | 12/2011 | Tomatsu ............ | G03G 21/1633 399/110 |
| 2012/0074824 | A1 * | 3/2012 | Fukui ................. | G03G 21/1647 292/195 |
| 2012/0293055 | A1 * | 11/2012 | Qiu ........................ | E05C 9/002 49/395 |
| 2017/0248902 | A1 * | 8/2017 | Yamamoto ......... | G03G 21/1633 |
| 2021/0034009 | A1 * | 2/2021 | Osawa ............... | G03G 21/1638 |

FOREIGN PATENT DOCUMENTS

JP    2011-158624    8/2011

* cited by examiner

*Primary Examiner* — Robert B Beatty
(74) *Attorney, Agent, or Firm* — Lex IP Meister, PLLC

(57) ABSTRACT

An openable door includes a first engaging member, a second engaging member, and at least one intermediate engaging member. when the openable door pivots from an open position to a closed position, an engaging portion of the first engaging member engages a first engaged portion, and an engaging portion of an engaging portion of the second engaging member engages a second engaged portion before an engaging portion of the intermediate engaging member engages an intermediate shaft body.

5 Claims, 8 Drawing Sheets

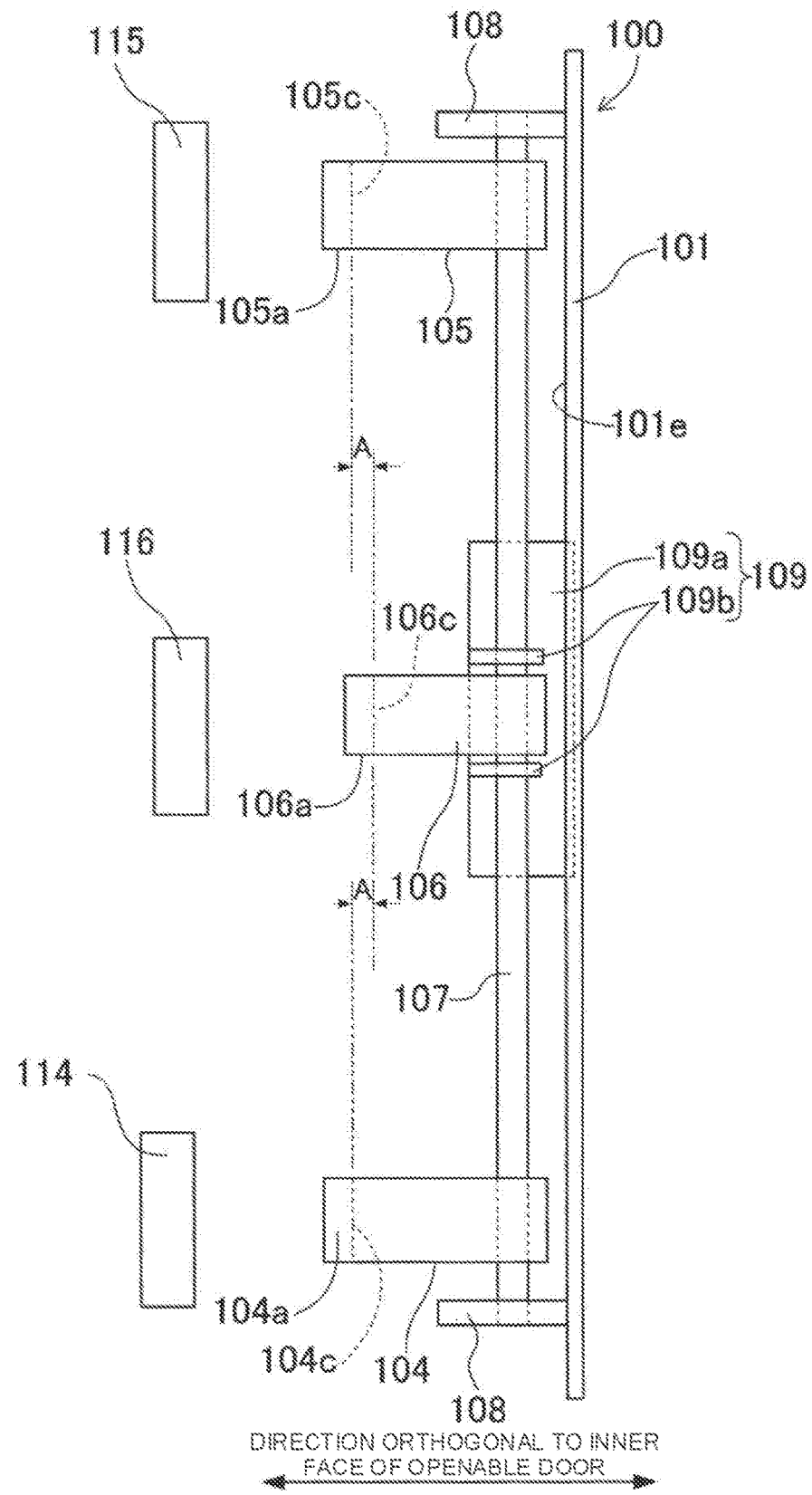

DIRECTION ORTHOGONAL TO
INNER FACE OF OPENABLE DOOR

OPENABLE DOOR MECHANISM

INCORPORATION BY REFERENCE

This application is based upon, and claims the benefit of priority from, corresponding Japanese Patent Application No. 2020-110346 filed in the Japan Patent Office on Jun. 26, 2020, the entire contents of which are incorporated herein by reference.

BACKGROUND

The disclosure relates to an openable door mechanism.

Typically, an openable door mechanism is known that opens and closes an opening formed in a side face of a housing by an openable door that can pivot about a support shaft. In this openable door mechanism, the lower end of the openable door is supported by a support shaft extending horizontally along the lower edge of the opening. The openable door is openable between a closed position at which the opening is fully closed and an open position at which the opening is opened by pivoting the door outward from the housing with the support shaft serving as a fulcrum. Two cover fixing hooks aligned along the door width direction are attached to the face of the openable door on the inner side of the housing. When the openable door pivots from the open position to the closed position, the two cover fixing hooks engage a shaft body disposed on the housing to hold the openable door at the closed position. When the openable door pivots from the closed position to the open position, the user pulls an operating handle disposed on the openable door toward himself or herself to release the engagement of the two cover fixing hooks with the shaft body.

SUMMARY

An openable door mechanism according to the disclosure includes an openable door that opens and closes an opening formed in a side face of a housing; a shaft that rotatably supports the openable door between an open position and a closed position, the shaft rotating around a rotation axis extending along one edge of the opening, the rotation axis being a fulcrum; a first engaging member including an engaging portion and protruding from a first edge portion along the rotation axis direction of the openable door on an opposing face of the openable door facing the opening, and a second engaging member including an engaging portion and protruding from a second edge portion along the rotation axis direction of the openable door on the face of the openable door facing the opening; and an engaged portion disposed on the housing, the engaged portion engaging the engaging portion of the first engaging member and the engaging portion of the second engaging member to lock the openable door to the closed position when the openable door pivots from the open position to the closed position.

At least one intermediate engaging member including an engaging portion protrude between the first engaging member and the second engaging member on the opposing face of the openable door, an intermediate engaged portion is disposed in the housing, the intermediate engaged portion engaging the engaging portion of the intermediate engaging member when the openable door pivots from the open position to the closed position, and when the openable door pivots from the open position to the closed position, the engaging portion of the first engaging member engages the first engaged portion and the engaging portion of the second engaging member engages the second engaged portion before the engaging portion of the intermediate engaging member engages the intermediate engaged portion.

BRIEF DESCRIPTION OF THE DRAWINGS

FIG. 3 is a plan view of the openable door mechanism from above immediately before the openable door shifts to the closed position;

FIGS. 4A to 4C are side views of locking members in the openable door mechanism immediately before the openable door shifts to the closed position, wherein FIG. 4A illustrates a rear locking member, FIG. 4B illustrates an intermediate locking member, and FIG. 4C illustrates a front locking member;

DETAILED DESCRIPTION

An embodiment of the disclosure will now be described in detail with reference to the accompanying drawings. Note that the disclosure is not limited to the following embodiment.

Embodiment

Figure 1:
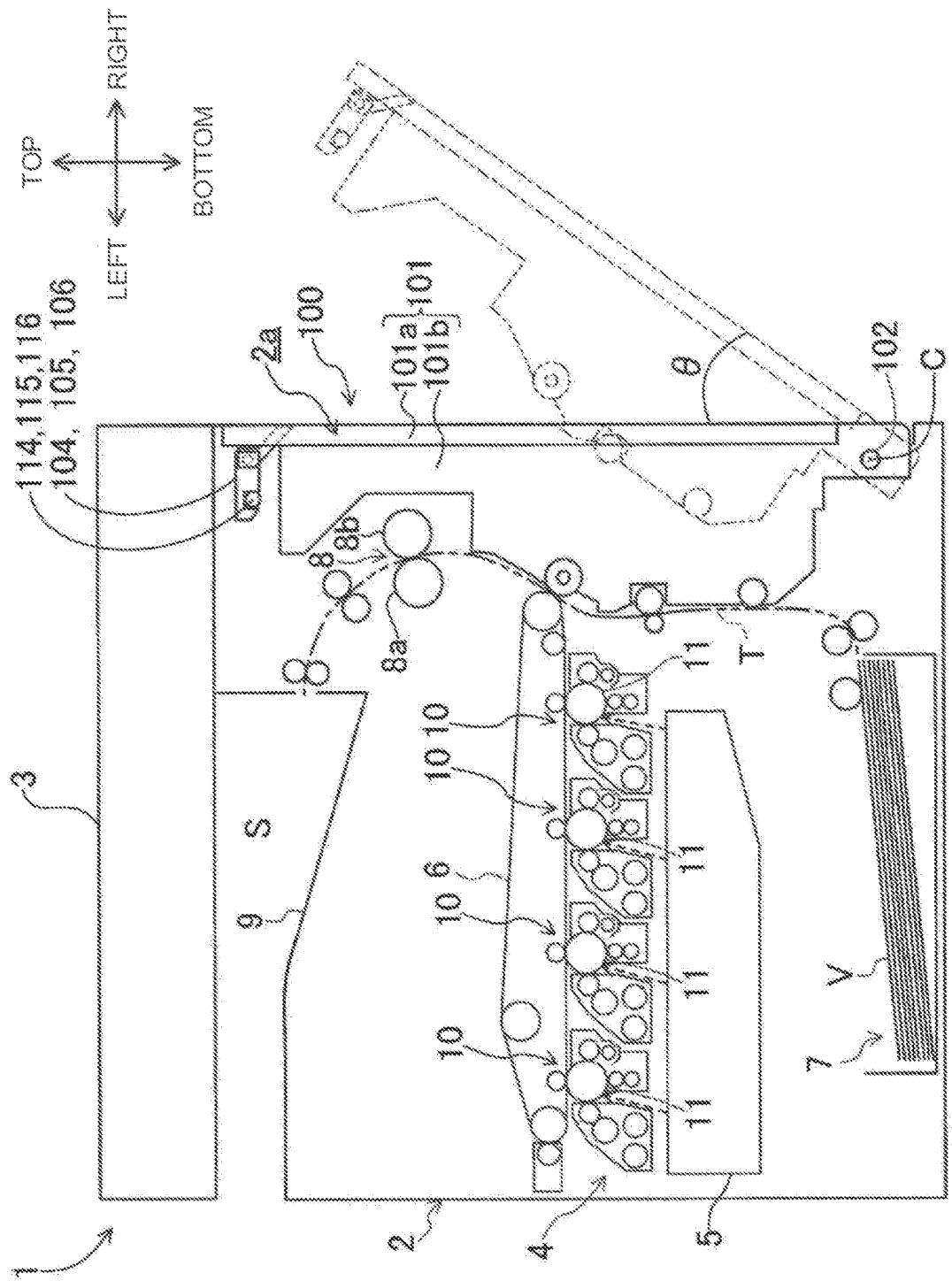
FIG. 1 is a schematic configuration diagram illustrating an image forming apparatus including an openable door mechanism according to an embodiment.

FIG. 1 is a schematic configuration diagram illustrating an image forming apparatus 1 including an openable door mechanism 100 according to an embodiment. In the following description, it is assumed that a front side and a rear side indicate a front side and a rear side, respectively, of the image forming apparatus 1, and a left side and a right side indicate a left side and a right side, respectively, when the image forming apparatus 1 is viewed from the front side.

The image forming apparatus 1 is a copier of an inner-cylinder output type, and includes a housing 2 and an image reading device 3 disposed on the upper side of the housing 2. The image reading device 3 optically reads a document image and generates image data.

An image forming section 4, which is disposed inside the housing 2, transfers an image on a sheet V on the basis of the image data of the document read by the image reading device 3. An exposure device 5 that emits a laser beam is disposed below the image forming section 4. A transfer belt 6 is disposed above the image forming section 4. A sheet feeder 7 that stores sheets V is disposed below the exposure device 5. A fixing unit 8, which is disposed above the right side of the transfer belt 6, fixes the image transferred onto a sheet V. A sheet output space S is provided between the housing 2 and the image reading device 3. The sheet V subjected to the fixing process by the fixing unit 8 is output into the sheet output space S. A sheet output tray 9 is formed on the upper face of the housing 2. The sheet output tray 9 receives the sheet V output into the sheet output space S. A sheet transport path T extends from the sheet feeder 7 to the sheet output tray 9 inside the housing 2. A rectangular opening 2a is formed on the right face of the housing 2, adjacent to the sheet transport path T. The opening 2a can be opened and closed by the openable door mechanism 100 including an openable door 101.

The image forming section 4 includes four image forming units 10 corresponding to yellow, magenta, cyan, or black colors. Each image forming unit 10 includes a photoreceptor drum 11. An electrostatic latent image written on the photoreceptor drum 11 by the exposure device 5 is developed by a developing unit and is visualized as a toner image of the corresponding color. The image forming section 4 sequentially transfers the toner images of the respective colors formed on the photoreceptor drums 11 of the image forming units 10 to an intermediate transfer belt so that the images are overlaid. The image forming section 4 then transfers the overlaid images to a sheet V supplied by the sheet feeder 7.

The fixing unit 8 includes a heating roller 8a and a pressure roller 8b. The fixing unit 8 heats and applies pressure to the toner images carried on the sheet V supplied by the image forming section 4 to thermally fix the toner images on the sheet V. The sheet V after the fixing process is output into the sheet output tray 9.

The openable door 101 includes a door body 101a and a guiding member 101b. The door body 101a has a rectangular plate shape that is long in the top-bottom direction. The guiding member 101b is attached to the inner face of the door body 101a. The guiding member 101b defines the sheet transport path T formed between the guiding member 101b and a guiding member (not illustrated) inside the housing 2.

Figure 2:
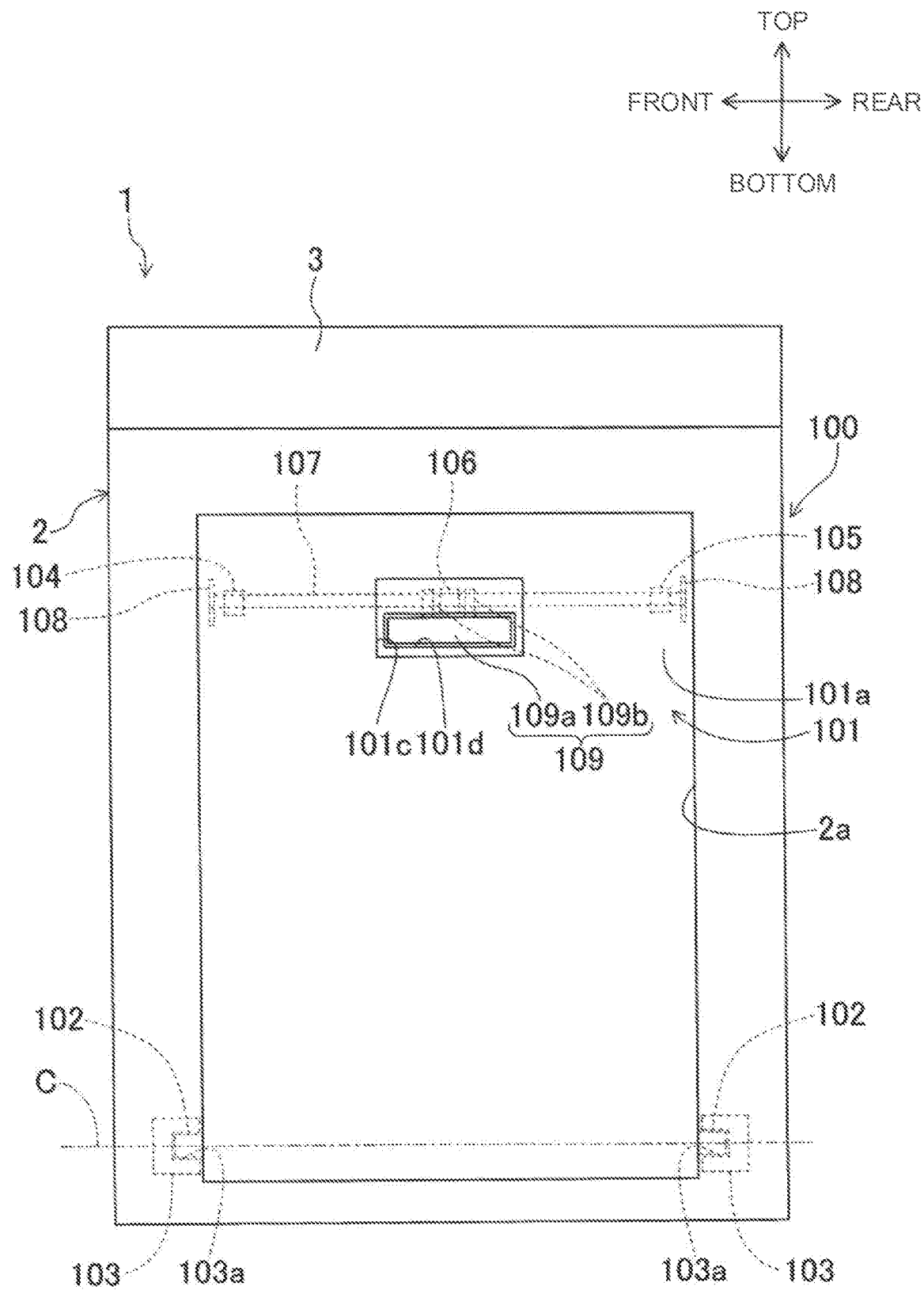
FIG. 2 is a right side view of the image forming apparatus in which an openable door is illustrated at a closed position.

Shafts 102 are disposed at the lower edge portion of the guiding member 101b of the openable door 101 and project from the two sides along the door width direction. The two shafts 102 are coaxially arranged. The axis C of the shafts 102 extend in the front-back direction along the lower edge of the opening 2a, as illustrated in FIG. 2. The two shafts 102 are rotatably supported in bearing holes 103a of bearing members 103 fixed to the right wall of the housing 2. The openable door 101 can pivot between the closed position and the open position about the shafts 102 serving as a fulcrum. At the closed position, the opening 2a of the housing 2 is closed by the openable door 101, as indicated by the solid lines in FIG. 1. As indicated by the double dot-and-dash lines in FIG. 1, at the open position, the openable door 101 pivots about the shafts 102 or fulcrum from the closed position in a direction outward from the apparatus (to the right in the example in FIG. 1), and the opening 2a is opened. Note that the maximum opening angle θ of the openable door 101 at the closed position is limited, for example, by a band-like elastic member or a linking member connecting the housing 2 and the openable door 101.

When the user pivots the openable door 101 from the closed position to the open position, the guiding member 101b pivots outward from the housing 2 about the shafts 102 serving as a fulcrum. This allows the user to remove sheets jammed in the sheet transport path T.

Details of Openable Door Mechanism 100

The detailed configuration of the openable door mechanism 100 will now be described with reference to FIGS. 2 and 3. FIG. 2 is a side view of the image forming apparatus 1 from the side on which the openable door mechanism 100 is provided (the right side). FIG. 3 is a view of the openable door mechanism 100 from the upper side the openable door 101 immediately before the openable door 101 shifts to the closed position.

Figure 4A:
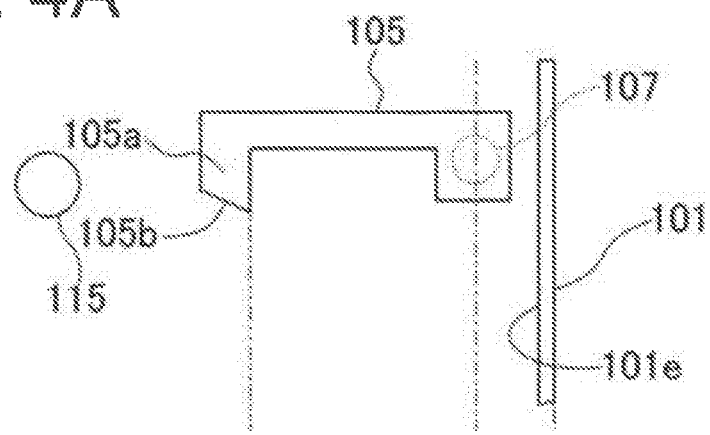
Figure 4B:
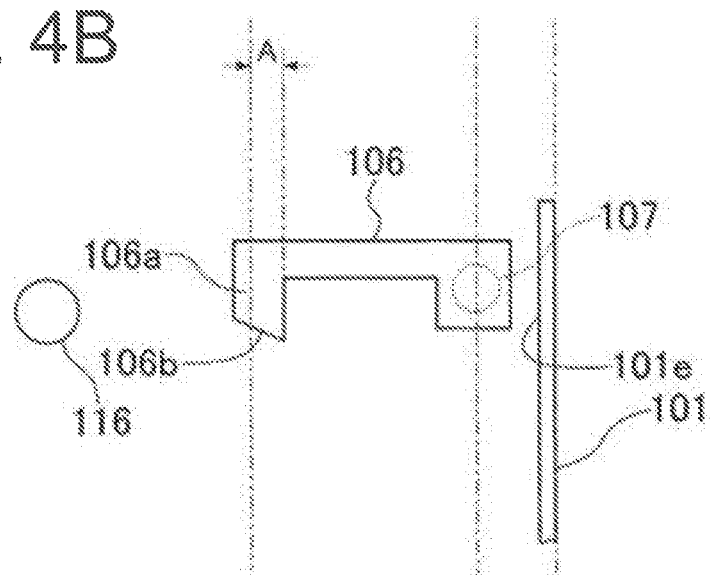
Figure 4C:
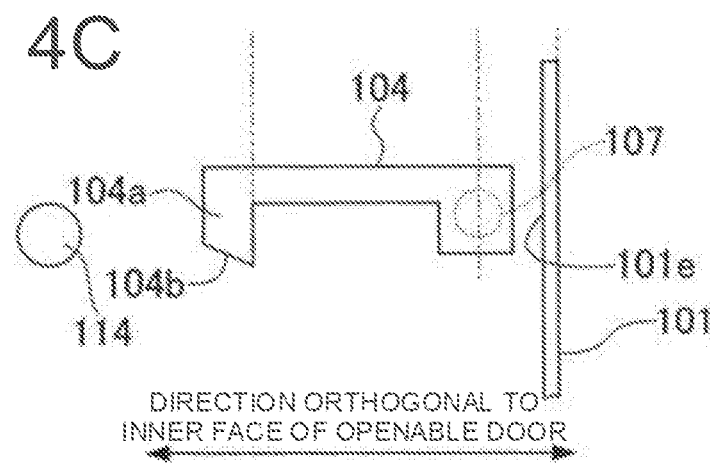

The openable door mechanism 100 includes a front locking member 104, a rear locking member 105, and an intermediate locking member 106 as members for locking the openable door 101 at the closed position. The locking members 104 to 106 each has a hook shape as illustrated in FIGS. 4A to 4C, respectively. The locking members 104 to 106 respectively engage shaft bodies 114 to 116 disposed on the housing 2 to hold the openable door 101 at the closed position. Note that the front locking member 104 corresponds to a first engaging member, the rear locking member 105 corresponds to a second engaging member, and the intermediate locking member 106 corresponds to an intermediate engaging member.

Specifically, as illustrated in FIGS. 2 and 3, the front locking member 104 and the rear locking member 105 respectively protrude from the front edge portion and the rear edge portion along the front-back direction on the inner face 101e of the openable door 101; and the intermediate locking member 106 protrudes from the central portion (an example of an intermediate portion) along the front-back direction on the inner face 101e of the openable door 101.

As illustrated in FIGS. 4A to 4C, the front locking member 104 and the rear locking member 105 have the same shape and respectively have engagement hooks 104a and 105a at their tips. The intermediate locking member 106 has the same basic shape as the front locking member 104 and the rear locking member 105, except for the protruding length being shorter than that of the front locking member 104 and the rear locking member 105. The intermediate locking member 106 has an engagement hook 106a at the tip. Tilting faces 104b to 106b that tilt upward toward the left in FIGS. 4A to 4C are formed on the tips (the lower ends when the openable door 101 is at the closed position) of the engagement hooks 104a to 106a of the locking members 104 to 106.

As illustrated in FIGS. 3 and 4A to 4C, the proximal ends of the locking members 104 to 106 are connected to and rotate together with a support shaft 107 extending horizontally in the front-back direction along the inner face 101e of the openable door 101. Both ends of the support shaft 107 along the front-back direction are rotatably supported by a protruding plate 108 protruding from the inner face 101e of the openable door 101.

Besides the intermediate locking member 106, an operation lever 109 is also connected to the central portion of the support shaft 107 along the front-back direction and rotates together with the support shaft 107. The operation lever 109 includes a lever body 109a and two connecting plates 109b. The lever body 109a has a rectangular plate-shape and extends in the front-back direction. The two connecting plates 109b are disposed apart from each other in the front-back direction and face each other. The lever body 109a is externally exposed through a recessed handle 101c (see FIG. 2) formed at the upper edge portion of the outer face of the openable door 101 (i.e., the other face of the openable door 101). A portion of the lever body 109a is disposed inside the housing 2 through a through hole 101d formed in the back wall (the wall on the back side along the direction orthogonal to the sheet of FIG. 2) of the recessed handle 101c.

The portion of the lever body 109a disposed inside the housing 2 is connected to the lower edges of the two connecting plates 109b. The upper edges of the two connecting plates 109b are fixed to the support shaft 107 so as to sandwich the proximal end of the intermediate locking member 106 (see FIG. 3) from both sides along the front-back direction.

As illustrated in FIG. 3, a front shaft body 114, a rear shaft body 115, and an intermediate shaft body 116 are attached to the locations corresponding to the front locking member 104, the rear locking member 105, and the intermediate locking member 106, respectively, in the upper edge portion inside the housing 2. The shaft bodies 114 to 116 are cylindrical shafts extending in the front-back direction and are coaxially disposed with respect to each other. The front shaft body 114 corresponds to a first engaged portion, the rear shaft body 115 corresponds to a second engaged portion, and the intermediate shaft body 116 corresponds to an intermediate engaged portion.

Figure 5:
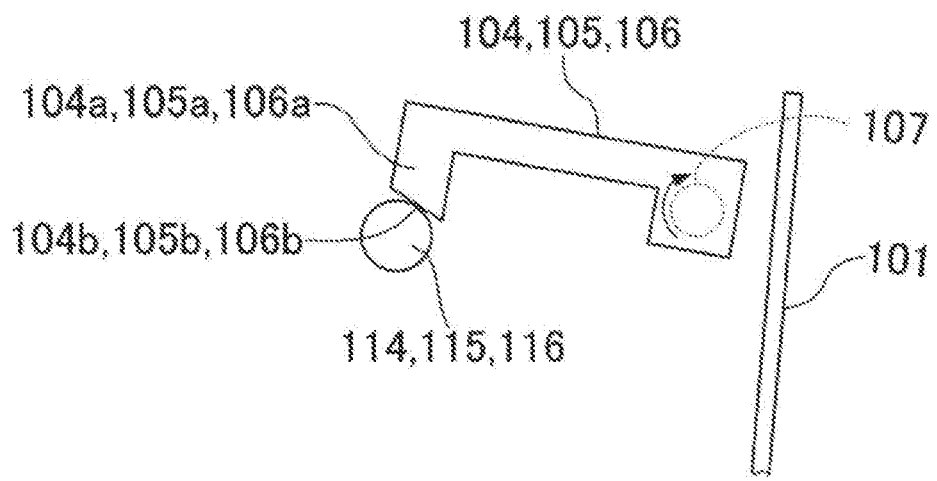
FIG. 5 is a diagram illustrating an engagement operation of each locking member.
Figure 6:
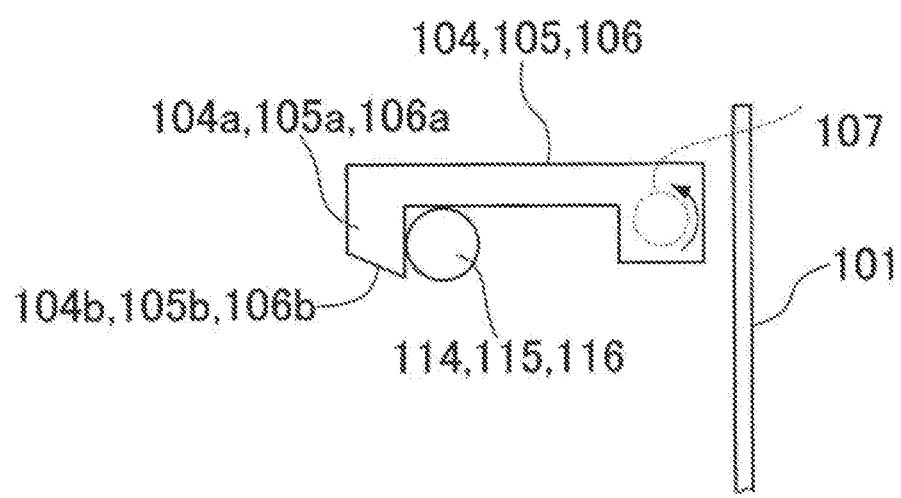
FIG. 6 is a diagram illustrating an engagement operation of each locking member.

FIG. 3 illustrates a state immediately before the protruding ends of the locking members 104 to 106 come into contact with the corresponding shaft bodies 114 to 116. By pivoting the openable door 101 from this state to the closed side (the left side in FIG. 3), the tilting faces 104b to 106b of the respective locking members 104 to 106 abut the shaft bodies 114 to 116, respectively, as illustrated in FIG. 5, to cause the locking members 104 to 106 to turn together with the support shaft 107 in the clockwise direction in FIG. 5, and thereby cause the openable door 101 in this state to pivot father toward the closed side. This causes the locking members 104 to 106 to move over the shaft bodies 114 to 116, respectively, and turn in the counterclockwise direction in FIG. 5 by their own weight. As a result, the engagement hooks 104a, 105a, and 106a of the respective locking members 104, 105, and 106 engage the shaft bodies 114, 115, and 116, respectively, and thereby lock the openable door 101 at the closed position, as illustrated in FIG. 6. Note that FIGS. 5 and 6 are simplified diagrams for explaining the operation, and thus the locking members 104 to 106 illustrated in these drawings have the same length. However, in reality, the length of the intermediate locking member 106 is slightly smaller than the others.

To unlock the openable door 101, the operation lever 109 should be manually pushed inward into the housing 2. This causes the support shaft 107 to turn in the clockwise direction in FIG. 6 together with the operation lever 109, and the three locking members 104 to 106 to turn in the clockwise direction in FIG. 6 together with the support shaft 107. As a result, the engagement of the locking member 104 to 106 with the respective shaft bodies 115 to 116 is released.

With a conventional openable door, the locking members are disposed only at the two edge portions along the width direction of the openable door. Therefore, depending on how the openable door is pushed (e.g., depending on the pushing position and the pushing force), one of the locking members may be insufficiently engaged, causing the openable door to be half-closed in which on only one of the locking members is locked.

In order to solve this problem, in the present embodiment, the intermediate locking member 106 is provided in addition to the front locking member 104 and the rear locking member 105, which are equivalent to the locking members at the two edge portions, and also the position of the engagement hook 106a of the intermediate locking member 106 is inventively determined.

Figure 7:
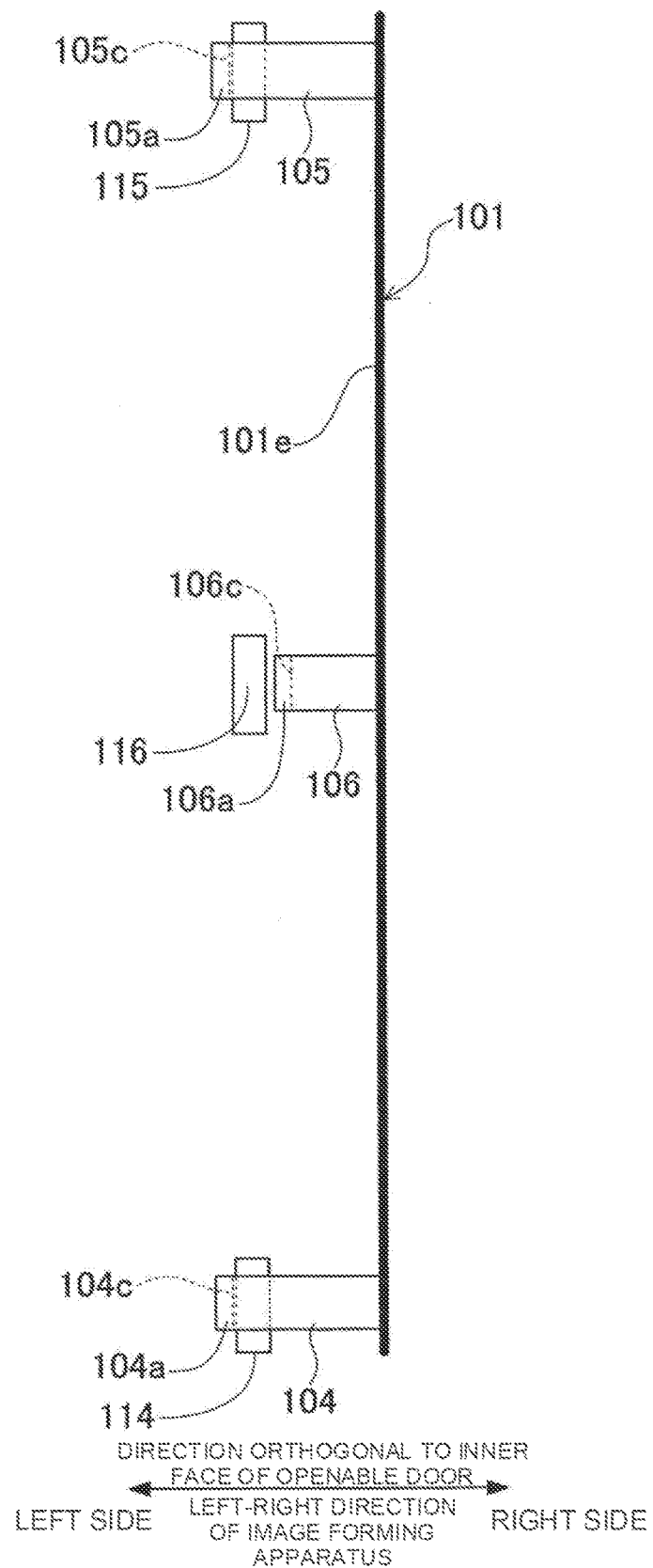
FIG. 7 is a diagram illustrating an engagement operation of each locking member and each corresponding shaft body when the openable door shifts to the closed position.
Figure 8:
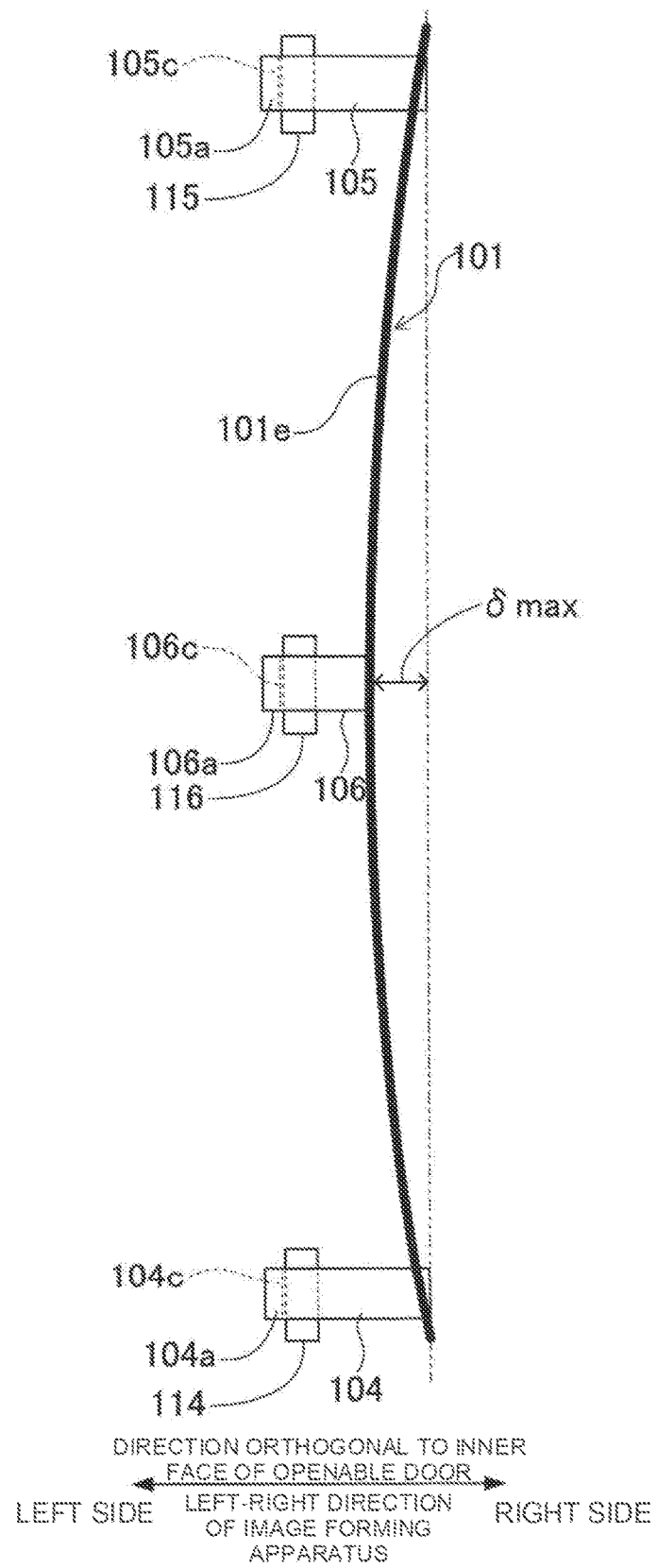
FIG. 8 is a diagram illustrating an engagement operation of each locking member and each corresponding shaft body when the openable door shifts to the closed position.

That is, as illustrated in FIGS. 7 and 8, the engagement hook 106a of the intermediate locking member 106 is disposed closer to the openable door 101 than the engagement hook 104a of the front locking member 104 and the engagement hook 105a of the rear locking member 105 (i.e., disposed remote from the shaft bodies 115 and 116) in the orthogonal direction of the inner face 101e of the openable door 101. In more detail, the engagement face 106c of the intermediate locking member 106 is located closer to the openable door 101 by a specific length A than the engagement face 104c of the front locking member 104 and the engagement face 105c of the rear locking member 105.

According to such a configuration, when the openable door 101 is to be shifted to the closed position, the front locking member 104 and the rear locking member 105 disposed on the two edge portions of the openable door 101 engage the front shaft body 114 and the rear shaft body 115, respectively, as illustrated in FIG. 7. Since the user pushes the handle 101c disposed in the central portion of the openable door 101, it is difficult for the user's hand to sense that the locking state of the front locking member 104 and the rear locking member 105 have been switched to an engaged state (a locked state). Therefore, the user continues to push the openable door 101 until the user's hand senses the locking feeling of the openable door 101. As a result, the openable door 101 warps in an arch shape when viewed from the upper side, as illustrated in FIG. 8, and the engagement hook 106a of the intermediate locking member 106 engages the intermediate shaft body 116. Since the intermediate locking member 106 is disposed in the central portion along the width direction of the openable door 101, which is the portion pushed by the user, the user's hand readily senses the locking feeling. Therefore, the user judges that the locking of the openable door 101 is completed when the intermediate locking member 106 engages the intermediate shaft body 116, and removes his/her hand from the handle 101c of the openable door 101 to complete the operation.

Figure 9:
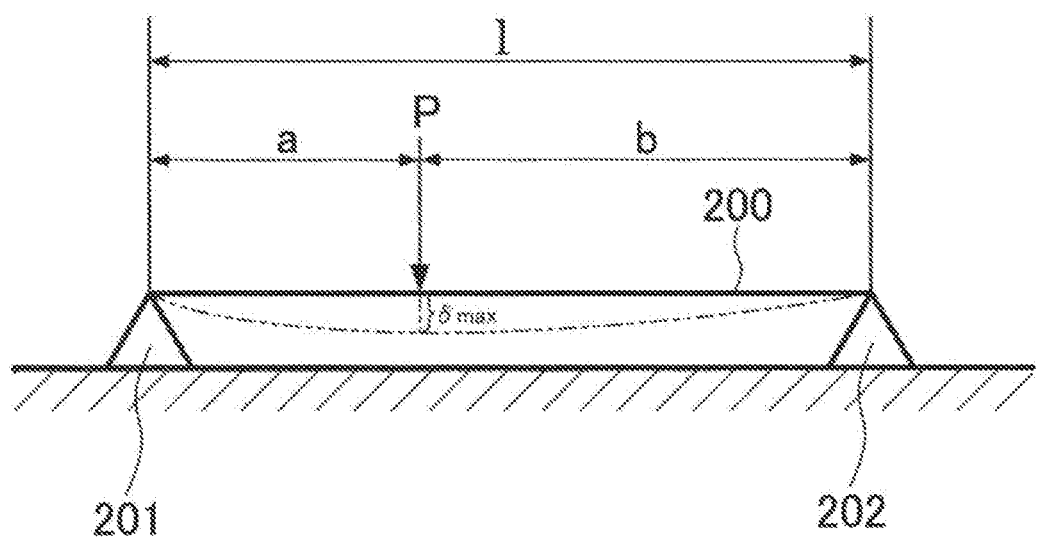
FIG. 9 is a schematic diagram illustrating a material mechanics model used to predict and calculate the maximum warpage in the thickness direction of the openable door.

As described above, in the present embodiment, when the openable door 101 is closed, the openable door 101 warps in an arch shape in the thickness direction, as illustrated in FIG. 9. If the warpage is large, the intermediate locking member 106 reaches and engages the shaft body 116 before the front locking member 104 and the rear locking member 105 reach and engage the front shaft body 114 and the rear shaft body 115, respectively. Therefore, the user may receive a locking feeling from the intermediate locking member 106 and stop pushing the openable door 101 before the locking of the front locking member 104 and the rear locking member 105 is completed.

To avoid this problem, in the present embodiment, the maximum warpage $\delta_{max}$ of the openable door 101 is predicted so that the distances between the engagement position of the engagement hook 106a of the intermediate locking member 106 and the engagement positions of the respective engagement hooks 104a and 105a of the other two locking members 104 and 105 are each greater than the predicted maximum warpage $\delta_{max}$ in the orthogonal direction of the inner face 101e of the openable door 101.

This can eliminate the problem of the intermediate locking member 106 engaging the intermediate shaft body 116, which is the engaged portion, before the front locking member 104 and the rear locking member 105 engage the front shaft body 114 and the rear shaft body 115, respectively, due to the warping of the openable door 101.

FIG. 9 is a schematic diagram illustrating a material mechanics model used to predict and calculate the maximum warpage $\delta_{max}$ of the openable door 101. By considering the transverse beam 200 illustrated in FIG. 9 to be the openable door 101, a left support point 201 and a right support point 202 to be the shafts 102 at the two edges of the openable door 101, and a specific load P to be the pushing force of the openable door 101 applied by the user, the maximum warpage δmax can be predicted and calculated by the following Equation (1) based on material mechanics.

$$\delta_{max} = \frac{Pb}{3EIl}\sqrt{\left\{\frac{a^2+2ab}{3}\right\}^3}$$ [Equation 1]

Here, E is a modulus of longitudinal elasticity of the openable door 101; I is a value obtained by calculating the cross-sectional secondary moments of the openable door 101 in a cross-section along a rotation axis direction (a horizontal cross-section at a specific position in the door height direction in FIG. 1) at multiple positions at equal intervals in the door longitudinal direction orthogonal to the rotation axis direction, and averaging the calculated values; l is a dimension of the openable door 101 along the rotation axis direction; P is a load set in advance as a load applied when the handle 101c is grasped and pushed by a user's hand; a is the distance from the front edge of the openable door 101 in the rotation axis direction to the center position of the handle 101c in the rotation axis direction; and b is the distance from the rear edge of the openable door 101 in the rotation axis direction to the center position of the handle 101c in the rotation axis direction.

In the present embodiment, since the position at which the specific load P is applied is the center (the position of the handle 101c), a=b. If a=b in Equation (1), the maximum warpage δmax can be predicted and calculated by the following Equation (2):

$$\delta_{max} = \frac{Pa^3}{6EI}$$ [Equation 2]

The specific load P can be set to a pushing force that is applied by an average-sized adult pushes the openable door 101 by hand. For example, the specific load P may be set based on the average value of the pushing forces applied by 100 adults to the openable door 101 when the openable door 101 is closed.

As described above, according to the openable door mechanism 100 of the present embodiment, when the openable door 101 pivots from the open position to the closed position, the engagement hook 104a of the front locking member 104 and the engagement hook 105a of the rear locking member 105 engage the front shaft body 114 and the rear shaft body 115, respectively, before the engagement hook 106a of the intermediate locking member 106 engages the intermediate shaft body 116. Therefore, the openable door 101 is less likely to be half-closed. Therefore, it is possible to eliminate the problem of amplification of mechanical vibration or damage to the openable door 101 due to operation of the image forming apparatus 1 in a state in which the openable door 101 is half-closed.

Other Embodiments

In the above-described embodiment, the guiding member 101b is attached to the inner face of the openable door 101, but the configuration is not limited thereto. Alternatively, no attachment may be disposed on the inner face 101e of the openable door 101.

In the above-described embodiment, an example in which the openable door mechanism 100 is applied to the image forming apparatus 1 has been described. However, the embodiments are not limited thereto.

As described above, the disclosure is useful for an openable door mechanism, in particular, useful for application to an image forming apparatuses, such as a printer, a facsimile, a copier, or an MFP.

What is claimed is:

1. An openable door mechanism comprising:
    an openable door that opens and closes an opening formed in a side face of a housing;
        a shaft that rotatably supports the openable door between an open position and a closed position, the shaft rotating around a rotation axis extending along one edge of the opening, the rotation axis being a fulcrum;
        a first engaging member including an engaging portion and protruding from a first edge portion along a rotation axis direction of the openable door on an opposing face of the openable door facing the opening, and a second engaging member including an engaging portion and protruding from a second edge portion along the rotation axis direction of the openable door on the opposing face of the openable door facing the opening; and
        a first engaged portion and a second engaged portion fixed to the housing, the first engaged portion engaging the engaging portion of the first engaging member and the second engaged portion engaging the engaging portion of the second engaging member when the openable door pivots from the open position to the closed position, wherein,
        at least one intermediate engaging member including an engaging portion protrude between the first engaging member and the second engaging member on the opposing face of the openable door,
        an intermediate engaged portion is disposed in the housing, the intermediate engaged portion engaging the engaging portion of the intermediate engaging member when the openable door pivots from the open position to the closed position, and
        when the openable door pivots from the open position to the closed position, the engaging portion of the first engaging member engages the first engaged portion and the engaging portion of the second engaging member engages the second engaged portion before the engaging portion of the intermediate engaging member engages the intermediate engaged portion.

2. The openable door mechanism according to claim 1, wherein an engagement position of the engaging portion of the intermediate engaging member is disposed closer to the opposing face of the openable door facing the opening than the engagement position of the engaging portion of the first engaging member and the engagement position of the engaging portion of the second engaging member along a direction orthogonal to the opposing face of the openable door.

3. The openable door mechanism according to claim 2, wherein a handle is disposed on a face of the openable door opposite to the opposing face of the openable door, in a position corresponding to the intermediate engaging member, a user being able to grasp the handle by hand.

4. The openable door mechanism according to claim 3, wherein the engagement position of the engaging portion of the first engaging member and the engagement position of the engaging portion of the second engaging member are aligned in the rotational axis direction, a distance between the engagement position of the engaging portion of the intermediate engaging member and the engagement position of the engaging portion of the first engaging member in the rotational axis direction is larger than a warpage δmax, the warpage δmax being a warpage of the openable door in a thickness direction when the openable door at the open position is pushed by a specific load P via the handle in a closing direction, the warpage δmax being calculated from the following Equation (1);

$$\delta_{max} = \frac{Pb}{3EIl}\sqrt{\left\{\frac{a^2+2ab}{3}\right\}^3}$$ [Equation 1]

where E is a modulus of longitudinal elasticity of the openable door; I is a value obtained by calculating the cross-sectional secondary moments of the openable door in a cross-section along a rotation axis direction at multiple positions at equal intervals in the door longitudinal direction orthogonal to the rotation axis direction, and averaging the calculated values; l is a dimension of the openable door along the rotation axis direction; P is a load set in advance as a load applied when the handle is grasped and pushed by a user's hand; a is a distance from a front edge of the openable door in the rotation axis direction to a center position of the handle in the rotation axis direction; and b is a distance from a rear edge of the openable door in the rotation axis direction to the center position of the handle in the rotation axis direction.

5. The openable door mechanism according to claim 1, wherein the intermediate engaging member comprises one intermediate engaging member disposed in a central portion along the rotation axis direction on the opposing face of the openable door.

* * * * *